(12) United States Patent
Matsuo et al.

(10) Patent No.: US 6,759,668 B2
(45) Date of Patent: Jul. 6, 2004

(54) PHOTOCONDUCTIVE SWITCH MODULE AND MANUFACTURING METHOD THEREOF

(75) Inventors: Daisuke Matsuo, Hachioji (JP); Tomoyuki Hatakeyama, Hachioji (JP)

(73) Assignee: Olympus Corporation, Tokyo (JP)

( * ) Notice: Subject to any disclaimer, the term of this patent is extended or adjusted under 35 U.S.C. 154(b) by 0 days.

(21) Appl. No.: 10/616,424

(22) Filed: Jul. 9, 2003

(65) Prior Publication Data

US 2004/0007661 A1 Jan. 15, 2004

(30) Foreign Application Priority Data

Jul. 9, 2002 (JP) ........................................ 2002-200210

(51) Int. Cl.[7] .......................... G02B 27/00; H01L 23/48
(52) U.S. Cl. ............................ 250/551; 250/214 SW; 257/82; 257/778
(58) Field of Search .......................... 250/551, 214 SW, 250/214 LS, 227.11, 227.24, 239; 257/80–82, 431–434, 777–782; 200/61.02; 29/832, 840

(56) References Cited

U.S. PATENT DOCUMENTS 6,252,221 B1    6/2001  Kaneko et al.
6,407,401 B1    6/2002  Kondoh et al.
6,643,920 B2 *  11/2003  Hori ............................ 29/832

* cited by examiner

*Primary Examiner*—Kevin Pyo
(74) *Attorney, Agent, or Firm*—Scully, Scott, Murphy & Presser

(57) ABSTRACT

The present invention is directed to a photoconductive switch module. The photoconductive switch module comprises a first substrate having light-emitting elements, a second substrate having photoconductive switch elements, whose number is equal to that of the light-emitting elements. The light-emitting elements face the photoconductive switch elements so that the photoconductive switch elements are turned on/off in accordance with lighting/distinction of the light-emitting elements. The photoconductive switch module further comprises a third substrate arranged between the first substrate and the second substrate. The third substrate has through holes, whose number is equal to that of the light-emitting elements. Drive light emitted from a light-emitting element is trapped within a through hole to travel to a photoconductive switch element. The first substrate and the third substrate are connected to each other by heating and pressure contacting of first metal members.

12 Claims, 5 Drawing Sheets

PHOTOCONDUCTIVE SWITCH MODULE AND MANUFACTURING METHOD THEREOF

CROSS-REFERENCE TO RELATED APPLICATIONS

This application is based upon and claims the benefit of priority from the prior Japanese Patent Application No. 2000-200210, filed Jul. 9, 2002, the entire contents of which are incorporated herein by reference.

BACKGROUND OF THE INVENTION

1. Field of the Invention

The present invention relates to a photoconductive switch module, which can be realized by a combination of light-emitting elements and photoconductive switch elements, and more particularly to a small photoconductive switch module in which photoconductive switch elements are integrated.

2. Description of the Related Art

U.S. Pat. No. 6,407,401B1 discloses a small high-frequency/high-performance photoconductive relay. The photoconductive relay, which realizes a small high-frequency switch, includes a photoconductive switch element, whose resistance varies according to the intensity of incident light, and a light-emitting element, which emits light to illuminate the photoconductive switch element, the photoconductive switch element and the light-emitting element being closely positioned to face each other. This photoconductive relay provides a minimum unit of a switch that can take the on state and the off state.

The photoconductive switch element is an important element when realizing a photoconductive relay (photoconductive switch) and, e.g., U.S. Pat. No. 6,252,221B1 discloses an example of such an element.

In order to realize a sophisticated switch module, photoconductive switch elements must be used to constitute a switch circuit.

In order to obtain good high-frequency characteristics, the circuit design must be carried out in such a manner that the layout becomes as compact as possible, i.e., wiring becomes short. That is, the photoconductive switch elements must be arranged in close proximity to each other.

BRIEF SUMMARY OF THE INVENTION

The present invention is, in one aspect, directed to a photoconductive switch module. The photoconductive switch module comprises a first substrate having light-emitting elements, a second substrate having photoconductive switch elements, whose number is equal to that of the light-emitting elements. The light-emitting elements face the photoconductive switch elements so that the photoconductive switch elements are turned on/off in accordance with lighting/extinction of the light-emitting elements. The photoconductive switch module further comprises a third substrate arranged between the first substrate and the second substrate. The third substrate has through holes, whose number is equal to that of the light-emitting elements. Drive light emitted from a light-emitting element is trapped within a through hole to travel to a photoconductive switch element. The first substrate and the third substrate are connected to each other by heating and pressure contacting of first metal members.

The present invention is, in another aspect, directed to a manufacturing method of such a photoconductive switch module. The manufacturing method comprises providing first metal members on a first surface of the third substrate facing the first substrate, and connecting the first substrate with the third substrate by heating and pressure contacting of the first metal members. The manufacturing method, more preferably, further comprises providing second metal members on a second surface of the third substrate facing the second substrate, and connecting the second substrate with the third substrate by heating and pressure contacting of the second metal members.

Advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Preferred embodiments according to the present invention will now be described hereinafter with reference to the accompanying drawings.

First Embodiment

A photoconductive switch module according to the first embodiment will now be described hereinafter with reference to FIGS. 1 to 6.

Figure 1:
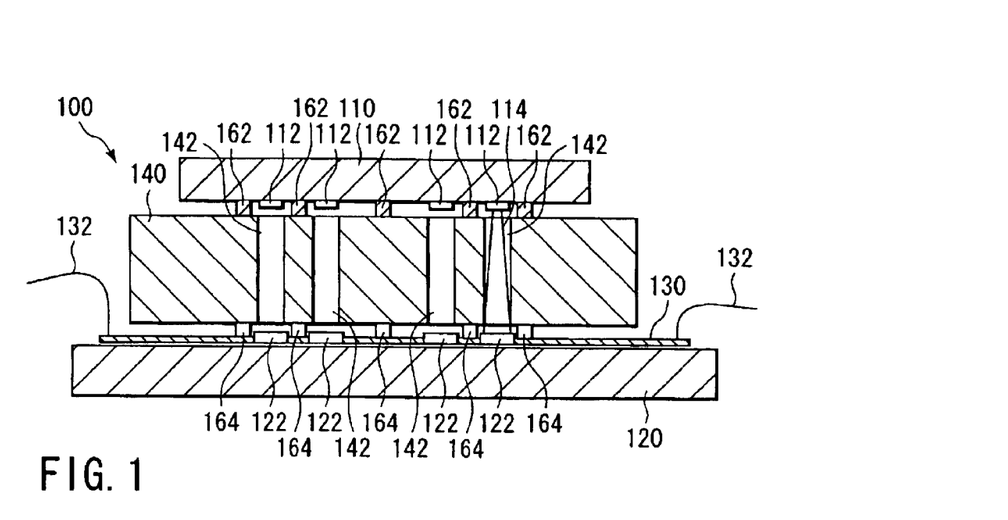
FIG. 1 shows a vertical cross section of a front face of a photoconductive switch module according to a first embodiment of the present invention.
Figure 2:
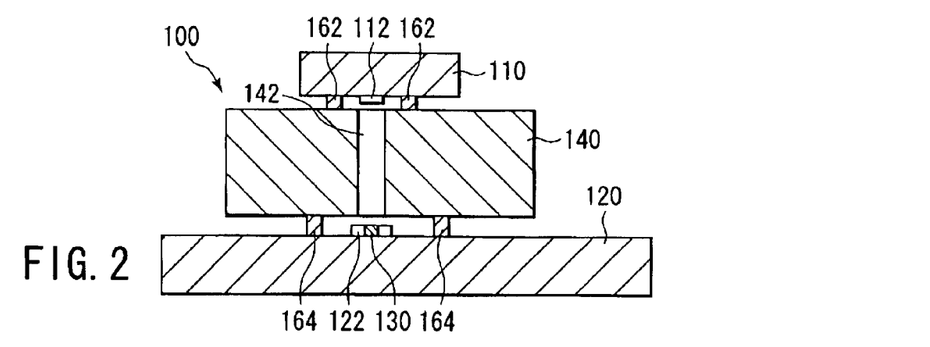
FIG. 2 shows a vertical cross section of a side surface of the photoconductive switch module depicted in FIG. 1.

As shown in FIGS. 1 and 2, a photoconductive switch module 100 has a light-emitting element substrate 110 as a first substrate having light-emitting elements 112, a switch element substrate 120 as a second substrate having photoconductive switch elements 122, whose number is equal to that of the light-emitting elements 112, and a spacer 140 as a third substrate arranged between the light-emitting element substrate 110 and the switch element substrate 120.

The light-emitting element substrate 110 and the spacer 140 are connected by heating and pressure contacting of bumps 162 as metal members. Likewise, the switch element substrate 120 and the spacer 140 are connected by heating and pressure contacting of bumps 164 as metal members.

The "heating and pressure contacting" is to connect metals by heat and pressure. Because of high temperature and pressure, the "heating and pressure contacting" provides a strong mechanical connection and electrical connection between metals due to any one of or varying combinations of a) fitting of fine surface configurations of metals (anchor effect), b) mutual diffusion of metal atoms, c) formation of alloy layer, and so on.

The light-emitting elements 112 and the photoconductive switch elements 122 are arranged to face each other. The spacer 140 has through holes 142, whose number is equal to that of the light-emitting elements 112, i.e., equal to that of the photoconductive switch elements 122. Each through hole 142, which has a size substantially equal to a size of the photoconductive switch element 122, is arranged between the light-emitting element 112 and the photoconductive switch element 122 facing each other. That is, the light-emitting element 112 and the photoconductive switch element 122 face each other via the through hole 142. In other words, the light-emitting element 112 and the photoconductive switch element 122 facing each other are optically coupled with each other via the through hole 142.

Further, the switch element substrate 120 has a circuit wiring 130 through the photoconductive switch elements 122 on the side facing the spacer 140. The photoconductive switch elements 122 and the circuit wiring 130 constitute an electric circuit suitable for an application of the photoconductive switch module 100. The circuit wiring 130 is connected to an external electric circuit through wires 132.

The light-emitting element 112 is, but is not limited to, e.g., a VCSEL (surface emitting laser). The photoconductive switch element 122, which is a photoconductive switch disclosed in, e.g., U.S. Pat. No. 6,252,221B1, is turned on/off in accordance with lighting/extinction of the light-emitting element 112. The document is incorporated in the present specification by reference.

In this specification, a term "photoconductive switch element" means a minimum unit that performs the electrical on/off operation of a line path running through this element by a change in resistance in response to illumination, and a term "photoconductive switch module" means a switch circuit constituted by a combination of photoconductive switch elements.

The photoconductive switch element 122 has a characteristic that, when it is not illuminated, has a high resistance, and while being illuminated, the resistance is reduced in accordance with the intensity of the incident light.

Therefore, the photoconductive switch element 122 demonstrates a high resistance when the corresponding light-emitting element 112 is off to take the off state (i.e., insulation state or open state).

When the light-emitting element 112 is lighted, drive light 114 emitted from the light-emitting element travels through the through hole 142 to illuminate the photoconductive switch element 122. As a result, the photoconductive switch element 122 has the resistance lowered, and is switched to the on state (conductive state).

When the light-emitting element 112 is extinguished, the photoconductive switch element 122 has the resistance increased to an initial value and returns to the off state (insulating state, open state).

Figure 3:
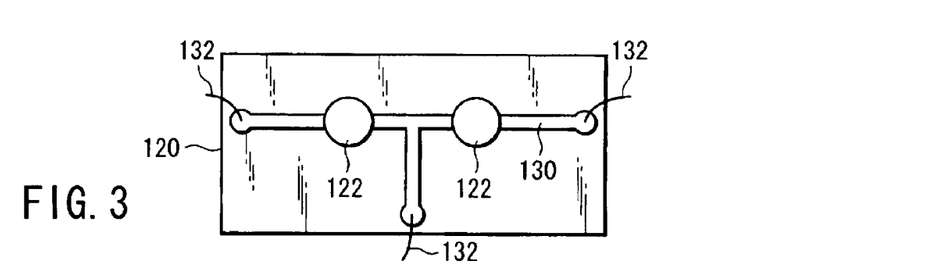
FIG. 3 shows one layout of photoconductive switch elements and a circuit wiring depicted in FIG. 1.
Figure 4:
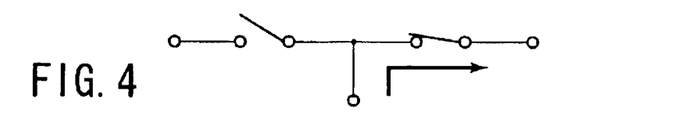
FIG. 4 shows an equivalent circuit of the photoconductive switch elements and the circuit wiring according to the layout depicted in FIG. 3.

For example, the photoconductive switch elements 122 and the circuit wiring 130 are laid out as shown in FIG. 3. As apparent from FIG. 4 showing an equivalent circuit, the photoconductive switch elements 122 and the circuit wiring 130 constitute a single-pole double-throw switch circuit (1:2 switch circuit). Of course, the photoconductive switch element 122 that is illuminated with the drive light is turned on, and the photoconductive switch element 122 that is not illuminated with the drive light is turned off.

Figure 5:
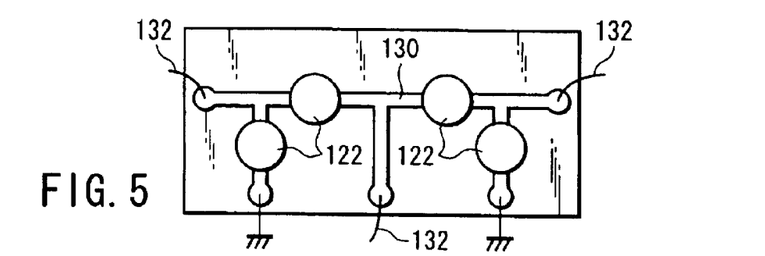
FIG. 5 shows a further preferable layout of the photoconductive switch elements and the circuit wiring depicted in FIG. 1.
Figure 6:
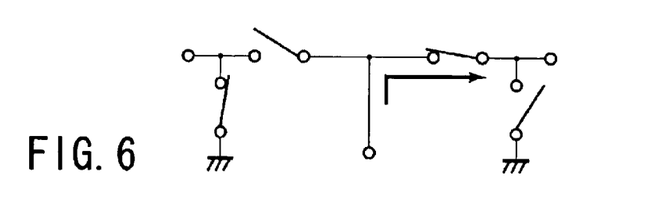
FIG. 6 shows an equivalent circuit of the photoconductive switch elements and the circuit wiring according to the layout depicted in FIG. 5.

Preferably, the photoconductive switch elements 122 and the circuit wiring 130 are laid out as shown in FIG. 5. As apparent from FIG. 6 showing an equivalent circuit, the photoconductive switch elements 122 and the circuit wiring 130 constitute a single-pole double-throw switch circuit, which avoids the influence of parasitic capacitances of the switch elements and whose characteristic is further improved.

Since the photoconductive switch element has the characteristic that the intensity of the drive light is substantially in inverse proportion to the resistance, if the leakage light of the drive light that is directed to the photoconductive switch element to be turned on enters the photoconductive switch element to be turned off, the photoconductive switch element to be turned off, whose resistance is lowered, fails to take the complete off state.

A beam of light projected from the light-emitting element such as a VCSEL is diverging. Further, as apparent from FIGS. 2 and 4, when one of the photoconductive switch elements adjacent to each other is turned on, the other one is turned off in many cases.

Therefore, in the photoconductive switch module constituted without providing the spacer 140 having the through holes 142, the light directed to the photoconductive switch element 122 to be turned on easily leaks into the photoconductive switch element 122 to be turned off. As a result, the resistance of the photoconductive switch element 122 to be turned off is lowered, resulting in deterioration in the transmission characteristic (loss or reflection) and the isolation characteristic as the switch circuit.

As shown in FIG. 1, however, in the photoconductive switch module 100 according to the present embodiment that has the spacer 140 having the through holes 142 between the light-emitting substrate 110 and the switch element substrate 120, the beam of drive light projected from the light-emitting element 112 is diverging, but its spread is restricted in the corresponding through hole 142. That is, the drive light 114 from the light-emitting element 112 is trapped within the through hole 142 to travel to the photoconductive switch element 122 facing the light-emitting element 112. As a result, this can suppress generation of the leakage light or incidence of the light upon another photoconductive switch element. That is, the resistance of the photoconductive switch element 122 to be turned off is kept sufficiently high.

Therefore, the photoconductive switch module 100 according to this embodiment has a compact circuit design but deterioration in the characteristic due to the leakage light is suppressed.

That is, the photoconductive switch module 100 according to this embodiment is sophisticated since the circuit is constituted by using the photoconductive switch elements, and it is small since the photoconductive switch elements are arranged in close proximity. Furthermore, it has the good characteristic since occurrence of the undesired leakage light is suppressed.

Moreover, in the photoconductive switch module 100 according to this embodiment, the light-emitting element substrate 110 and the spacer 140, and the switch element substrate 120 and the spacer 140 are respectively connected by heating and pressure contacting of bumps 162 and 164 in place of die bonding using an adhesive or a solder.

It is preferable that the light-emitting element substrate 110, the spacer 140 and the switch element substrate 120 are connected to each other, i.e., fixed and mounted without imposing a burden on the photoconductive switch elements 122 or the circuit wiring 130 provided on the switch element substrate 120. In order to realize this, the light-emitting element substrate 110, the spacer 140 and the switch element substrate 120 must be fixed and mounted with gaps therebetween. However, when each gap is too large, the utilization rate of the light is lowered or the leakage light is generated. Therefore, the gaps between the respective substrates should be small. Additionally, the light-emitting element substrate 110, the spacer 140 and the switch element substrate 120 must be fixed without adversely affecting the fine structure of the through holes 142 and the like.

As described above, since the light-emitting element substrate 110, the spacer 140 and the switch element substrate 120 are connected to each other by heating and pressure contacting of the bumps 162 and 164, they are stably fixed with small gaps therebetween. Further, since the adverse affect due to inflow of a solder, a resin adhesive agent or the like into the through holes 142 is not generated, the drive light from each light-emitting element 112 efficiently travels to the photoconductive switch element 122.

Furthermore, since the light-emitting element substrate 110, the spacer 140 and the switch element substrate 120 are connected to each other through the bumps 162 and 164, the heat generated in the light-emitting elements 112 can be efficiently radiated to the switch element substrate 120 through the spacer 140. As a result, deterioration in the characteristic of the light-emitting elements 112 can be greatly suppressed as compared with a case that the substrates are connected to each other by an adhesive or the like. This is useful for maintenance of the good characteristic and long life.

Here, general connection using the bumps will now be briefly described.

Each bump is a metal convex portion provided on an electrode of the substrate, and it is provided by plating, mounting of a solder ball, a ball bonding method and the like. The predetermined number of convex portions provided on the electrode of the substrate in this manner are pressed against an electrode of the substrate to be connected, and mechanical connection between the two substrates and electrical connection between the electrodes provided on these substrates are collectively carried out by pressurization, heating or using a resin. This operation is called bump connection.

In general, the electrical and mechanical connection between the substrates is carried out by fixing the substrates through an anisotropic electro-conductive paste or an epoxy resin and bonding the bumps and the electrodes by the curing contractile force of the resin or the paste. Further, it may be effected by injecting an epoxy resin called an under filling and hardening it on a later stage in some cases.

Such a connection is used in flip chip packaging that an IC chip is mounted on a circuit board by using an anisotropic electro-conductive resin paste.

On the other hand, in the present invention, the electrical and mechanical connection between the substrates is effected by heating and pressure contacting without using an anisotropic electro-conductive paste or a filling resin called an under filling for reinforcement.

As the bumps 162 and 164, gold ball bumps are preferable, and the gold ball bumps can be configured to be smaller than ball bumps formed of any other material, e.g., solder ball bumps. Specifically, the solder ball bump disadvantageously has both a diameter and a height of approximately 1 mm even if it is formed small. On the contrary, the gold ball bump can be manufactured with, e.g., a diameter of approximately 100 $\mu$m and a height of approximately 50 $\mu$m. As a result, it is possible to constitute the switch element substrate to be smaller, i.e., constitute the switch circuit with a short wiring length. That is, a use of the gold ball bumps greatly contributes to a reduction in size.

Furthermore, the gold bumps are different from the solder bumps, and they are not fused at the time of heating and pressure contacting. Therefore, there is less difficulty in control of gaps between the respective substrates due to fusion and collapse of the bumps, which is expected in heating and pressure contacting of the solder bumps, and the contact between the substrates can be readily avoided. The gold bumps can be manufactured on a thin film of aluminum or gold and joined to the gold thin film by heating and pressure contacting. Therefore, it is preferable to provide a thin film of gold or aluminum to the spacer 140 in an area including parts where the gold bumps are provided and also provide a thin film of gold in an area including parts that are in contact with the gold bumps with respect to the light-emitting element substrate 110 or the switch element substrate 120.

Such a connection established by heating and pressure contacting of the gold bumps provides the sufficient bonding strength. Therefore, it is not necessary to put the under filling for reinforcement or use a resin such as an anisotropic electro-conductive paste. Therefore, the flowing resin does not close the through holes nor cover the light-emitting elements or the switch elements. That is, a use of the gold ball bumps also greatly contributes to maintenance of the good characteristic.

As apparent from the above description, in the photoconductive switch module 100 according to this embodiment, since the light-emitting element substrate 110, the spacer 140 and the switch element substrate 120 are connected by heating and pressure contacting of the bumps as metal members, the fine structure of the through holes 142 and the like is not adversely affected, and these substrates are stably fixed with small gaps therebetween. Therefore, the heat generated by the light-emitting elements is efficiently radiated, which results in long life.

That is, according to this embodiment, the sophisticated small photoconductive switch module having the good characteristic can be provided.

Second Embodiment

A photoconductive switch module according to a second embodiment will now be described with reference to FIGS. 7 and 9. In the drawings, like reference numerals denote members equivalent to those in the photoconductive switch module according to the first embodiment. In the following, detailed explanation of these members is eliminated in order to avoid tautological description.

Figure 7:
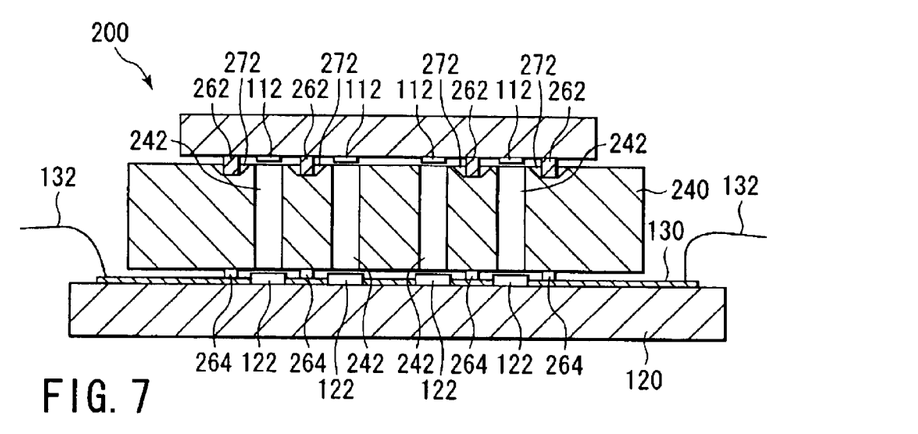
FIG. 7 shows a vertical cross section of a front face of a photoconductive switch module according to a second embodiment of the present invention.
Figure 8:
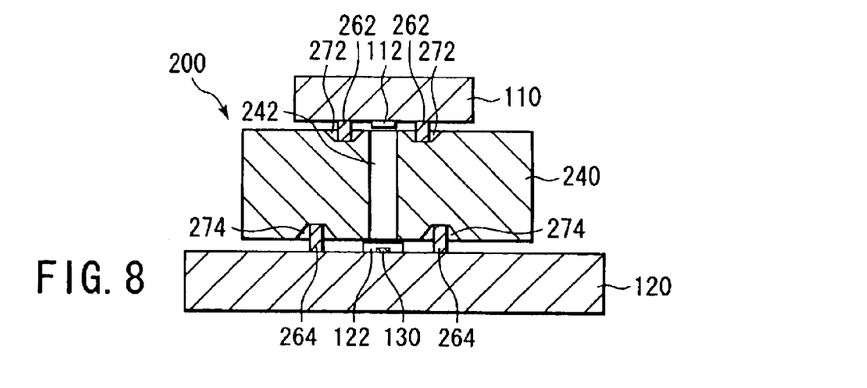
FIG. 8 shows a vertical cross section of a side surface of the photoconductive switch module depicted in FIG. 7.

As shown in FIGS. 7 and 8, a photoconductive switch module 200 has a light-emitting element substrate 110 having light-emitting elements 112, a switch element substrate 120 having photoconductive switch elements 122, whose number is equal to that of the light-emitting elements 112, and a spacer 240 arranged between the light-emitting element substrate 110 and the switch element substrate 120.

Figure 9:
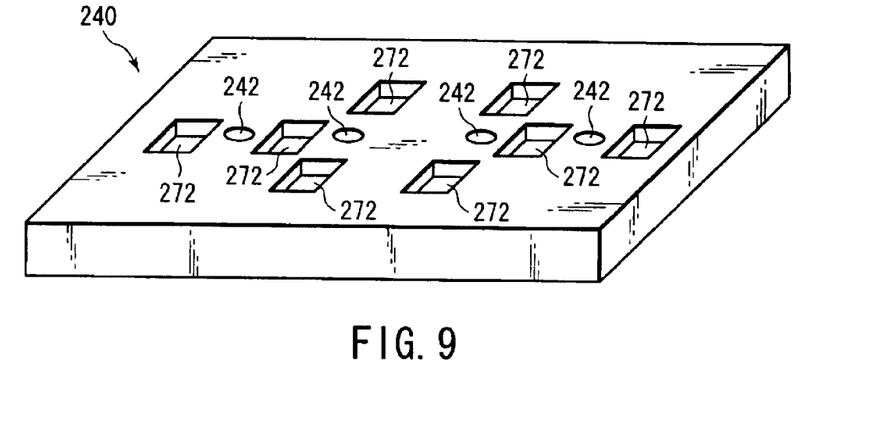
FIG. 9 is a perspective view of a side of a spacer depicted in FIGS. 7 and 8 facing a light-emitting element substrate.

As shown in FIGS. 7 to 9, the spacer 240 has through holes 242 arranged between the light-emitting elements 112 and the photoconductive switch elements 122, concave portions 272 formed on the side facing the light-emitting element substrate 110, and concave portions 274 formed on the side facing the switch element substrate 110. For example, the spacer 240 is manufactured from a silicon substrate, and the concave portions 272 and 274 are formed by etching the silicon substrate, which is a base material of the spacer 240.

The light-emitting element substrate 110 and the spacer 240 are connected by heating and pressure contacting of bumps 262 provided at the concave portions 272. Likewise, the switch element substrate 120 and the spacer 240 are connected by heating and pressure contacting of bumps 264 provided at the concave portions 274.

For example, assuming that the bumps 262 and 264 have a height of 50 $\mu$m and the concave portions 272 and 274 have a depth of 30 $\mu$m, a distance from the light-emitting element substrate 110 to the spacer 140 and that from the switch element substrate 120 to the spacer 140 are 20 $\mu$m, respectively. As described above, forming the concave portions 272 and 274 to the spacer 140 enables the light-emitting element substrate 110 and the switch element substrate 120 to be arranged relative to the spacer 140 with a distance smaller than the height of the bumps 262 and 264.

Considering a collapse depth of the bumps 262 and 264 when mounting, an elastic distortion of the bumps 262 and 264 at the time of pressure contacting or an error in shape when forming the concave portions 272 and 274, it is preferable to set the depth of the concave portions 272 and 274 within a range of 40% to 80% of the height of the bumps 262 and 264.

In this embodiment, since the concave portions 272 and 274 (depth: 30 $\mu$m) are formed to the spacer 240 on both sides facing the light-emitting elements 112 and the side facing the photoconductive switch elements 122, the light-emitting elements 112 and the photoconductive switch elements 122 are arranged with a distance therebetween being reduced by 60 $\mu$m as compared with the case that the height of the bumps is 50 $\mu$m in the structure according to the first embodiment. If a thickness of the substrate as a base material of the spacer 240 is, e.g., 200 $\mu$m, a distance between the light-emitting element substrate 110 and the switch element substrate 120 is 300 $\mu$m in the structure equal to that in the first embodiment. In this embodiment, however, it is 240 $\mu$m, which is improved 20%.

In particular, if each light-emitting element 112 is a light source having a large spread angle like a VCSEL, since the efficiency that its drive light reaches the photoconductive switch element 122 is in inverse proportion to a square of the distance, the drive light from the light-emitting element 112 very efficiently reaches the photoconductive switch element 122.

Furthermore, since the distances (gaps) between the light-emitting element substrate 110, the spacer 140 and the switch element substrate 120 become small, it is possible to effectively prevent the drive light emitted by the light-emitting element 112 from entering the gaps between the substrates and leaking into the adjacent photoconductive switch element 122 or the adjacent through hole 242. That is, occurrence of the leakage light is effectively suppressed.

In this case, as the distances (gaps) between the substrates, approximately 5 $\mu$m to 100 $\mu$m is preferable, approximately 10 $\mu$m to 50 $\mu$m is more preferable, and approximately 10 $\mu$m to 30 $\mu$m is most preferable. If such a distance is adopted, the leakage light can be substantially completely attenuated by multiple reflections between the substrates. In this embodiment, even if the metal bumps with a large height are used, the distances between the substrates can be reduced to, e.g., approximately 20 $\mu$m. Usually, this is a substrate gap that is achieved by only bonding using an adhesive.

Moreover, in this embodiment, the bumps having a height larger than the distances between the respective substrates are applied on the both surfaces of the spacer 240. Therefore, even if the respective substrates have different linear thermal expansion coefficients, the thermal stress applied on the connected parts between the substrates which is generated due to a difference in deformation quantity of the substrates which is provoked by heat generation of the light-emitting elements, a fluctuation in an environmental temperature, a change in temperature in a mounting process or the like of the switch module can be eased when the bumps having a large height are bent in a shear direction (lateral direction). As a result, warpage of the switch module, peeling of the bumps or cracks of each substrate can be effectively prevented, thereby improving the durability of the module.

Such an advantage is not generated when the substrates are bonded in large areas in close proximity (e.g., 20 $\mu$m) by using a solder or an adhesive.

In order to alleviate the thermal stress, it is effective to set a height with respect to a thickness of each bump to some extent. For example, it is possible to apply a bump having a height of 50 $\mu$m with respect to a bump diameter of 100 $\mu$m. In regard to an aspect ratio of the bump, a range that (diameter: height) is approximately (1:2) to approximately (3:1) is preferable.

It is to be noted that the bumps cannot be deformed when reinforcement is carried out by using a resin such as an under filling on a later stage, and hence such an advantage is eliminated.

Since the operation of the photoconductive switch module is the same as that of the first embodiment, thereby omitting its explanation.

As apparent from the above description, according to this embodiment, as compared with the photoconductive switch module of the first embodiment, the concave portions are formed to the spacer 240, the bumps are provided at the concave portions and the distances between the substrates are thereby reduced, which improves the characteristic. Additionally, there is provided the photoconductive switch module whose durability is improved by absorption of the thermal stress applied on the connected parts between the substrates by the bumps.

Third Embodiment

This embodiment aims at another spacer, which can be applied in place of the spacer 240 in the photoconductive switch module according to the second embodiment. The spacer according to this embodiment will now be described with reference to FIG. 10.

Figure 10:
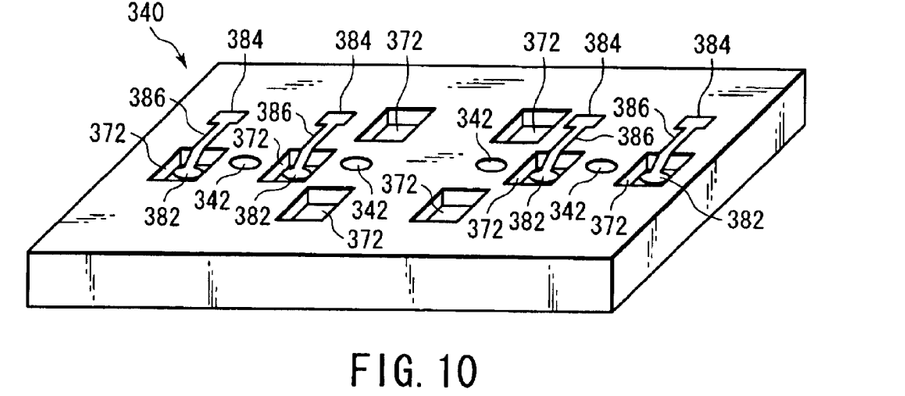
FIG. 10 is a perspective view of a side of a spacer according to a third embodiment facing a light-emitting element substrate, which can be applied in place of the spacer in the photoconductive switch module according to the second embodiment depicted in FIGS. 7 and 8.

As shown in FIG. 10, a spacer 340 has through holes 342 and concave portions 372 formed on the side facing the light-emitting element substrate 110. Although not shown, the spacer 340 further has concave portions formed on the side facing the switch element substrate 120, like the second embodiment.

Furthermore, the spacer 340 has electrode pads provided on bottom surfaces of some concave portions 372, electrode pads 384, which are provided at parts excluding the concave portions 372 on the surface facing the light-emitting element substrate 110 and whose number is equal to that of the electrode pads 382, and wirings 386 electrically connecting the respective electrode pads 382 with the respective electrode pads 384.

On the bottom surface of each concave portion 372 is provided a bump which is equal to the bump 262 according to the second embodiment, and the spacer 340 and the light-emitting element substrate 110 are electrically and mechanically connected to each other by heating and pressure contacting of these bumps. In particular, at each concave portion 372 having the electrode pad 382 provided on the bottom surface thereof, the bump is provided on the electrode pad 382, and that bump is connected with a drive electrode of the light-emitting element substrate 110. As a result, each electrode pad 384 of the spacer 340 is electrically connected to each light-emitting element 112 of the light-emitting element substrate 110 through each bump.

In a structure that the spacer 340 is connected with the light-emitting element substrate 110, the electrode pads 384 are arranged to be positioned on the outer side of the light-emitting element substrate 110. As a result, the wire bonding can be readily carried out with respect to the electrode pads 384.

In order to avoid breaking of the wires 386, each concave portion 372 preferably has slant side surfaces. That is, edges or corners of each concave portion 372 preferably have obtuse angles. Such a concave portion 372 can be formed by applying, e.g., anisotropic etching to an Si substrate, which is a base material of the spacer 340.

In the photoconductive switch module including the spacer 340 according to this embodiment, since the electrode pads 384 electrically connected to the light-emitting elements 112 of the light-emitting element substrate 110 are exposed on the same side as the wiring of the switch element substrate 120 (see FIG. 7), the wiring can be readily carried out by utilizing the wire bonding.

Fourth Embodiment

A photoconductive switch module according to the fourth embodiment will now be described with reference to FIG. 11. In the drawing, like reference numerals denote members equivalent to those in the photoconductive switch module according to the first embodiment. In the following, detailed explanation of these members is eliminated, thereby avoiding tautological description.

Figure 11:
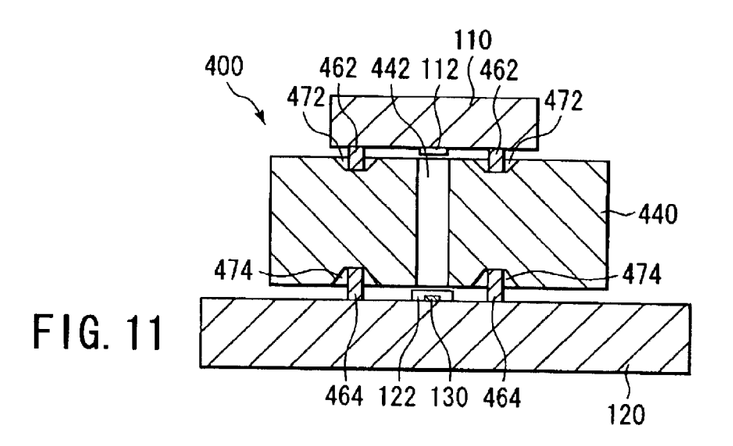
FIG. 11 shows a vertical cross section of a side surface of a photoconductive switch module according to a fourth embodiment of the present invention.

As shown in FIG. 11, a photoconductive switch module 400 has a light-emitting element substrate 110 having light-emitting elements 112, a switch element substrate 120 having photoconductive switch elements, whose number is equal to that of the light-emitting elements 112, and a spacer 440 arranged between the light-emitting element substrate 110 and the switch element substrate 120.

The spacer 440 has through holes 442 arranged between the light-emitting elements 112 and the photoconductive switch elements 122, concave portions 472 formed on the side facing the light-emitting element substrate 110, and concave portions 474 formed on the side facing the switch element substrate 120.

The light-emitting element substrate 110 and the spacer 440 are connected to each other by heating and pressure contacting of bumps 462 provided at the concave portions 472. Likewise, the switch element substrate 120 and the spacer 440 are connected to each other by heating and pressure contacting of bumps 464 provided at the concave portions 474.

The bumps 462 and the bumps 464 are provided at positions that substantially overlap in the vertical direction of the spacer 440. That is, for example, the projections of the bumps 462 relative to a flat surface parallel to the surface of the spacer 440 facing the switch element substrate 120 substantially overlap the projections of the bumps 464 each other. In other words, the concave portion 472 and the concave portion 472 are formed at substantially the same positions on the upper and lower surfaces of the spacer 440.

Therefore, when the light-emitting element substrate 110 and the switch element substrate 120 are simultaneously mounted on the spacer 140, the both surfaces of the spacer 140 are supported by the bumps 462 and 464, thereby effectively preventing the spacer 140 from being distorted or fractured.

Further, when the light-emitting element substrate 110 and the switch element substrate 120 are sequentially mounted on the spacer 140, since the bumps of the substrate which is mounted later are supported by the bumps of the substrate which is mounted precedently, the pressure loss at the time of mounting can be avoided, and the bumps can be efficiently pressure-welded with a lower pressure.

As to alignment of the upper and lower bumps, it is preferable that at least the circular outer peripheries of the bumps overlap when seen from the above, and more preferable that the center of one bump overlaps that of the other bump.

That is, the above-described advantages can be obtained as long as the positions of the bumps partially match with each other in the vertical direction even if they do not precisely overlap each other.

According to this embodiment, the light-emitting element substrate 110 and the switch element substrate 120 are mounted to the spacer 140 by pressure contacting of the bumps with a lower pressure.

Fifth Embodiment

A photoconductive switch module according to a fifth embodiment will now be described with reference to FIG. 12. In the drawing, like reference numerals denote parts equivalent to those in the photoconductive switch module according to the first embodiment. In the following, detailed explanation of these members will be eliminated, thereby avoiding tautological description.

Figure 12:
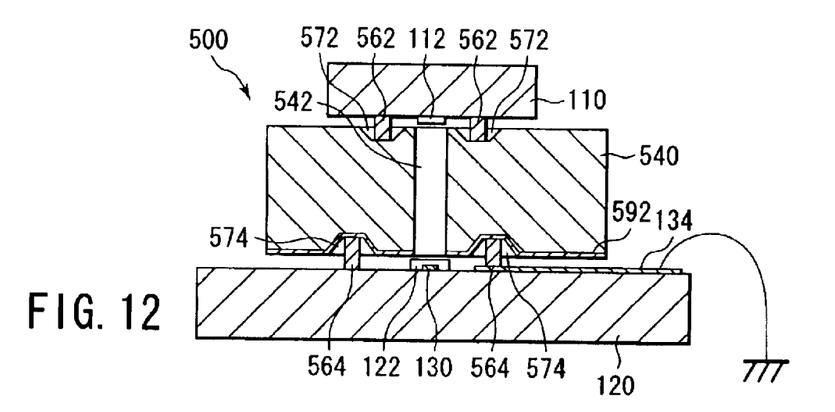
FIG. 12 shows a vertical cross section of a side surface of a photoconductive switch module according to a fifth embodiment of the present invention.

As shown in FIG. 12, a photoconductive switch module 500 has a light-emitting element substrate 110 having light-emitting elements 112, a switch element substrate 120 having photoconductive switch elements 122, whose number is equal to that of the light-emitting elements 112, and a spacer 540 arranged between the light-emitting element substrate 110 and the switch element substrate 120.

The spacer 540 has through holes 542 arranged between the light-emitting elements 112 and the photoconductive switch elements 122, concave portions 572 formed on the side facing the light-emitting element substrate 110, and concave portions 574 formed on the side facing the switch element substrate 120.

The spacer 540 has an electro-conductive part at least near the side facing the switch element substrate 120. Therefore, the spacer 540 has a metal film 592 provided on the side of the spacer 540 facing the switch element substrate 120. That is, the electro-conductive part comprises the metal film 592 provided on the surface of the spacer 540 facing the switch element substrate 120. However, the spacer 540 does not have to have such a metal film 592, and the spacer 540 itself may be formed of an electro-conductive material.

The switch element substrate 120 has a ground electrode 134, which is provided on the side facing the spacer 540 and maintained at a ground potential.

The light-emitting element substrate 110 and the spacer 540 are connected to each other by heating and pressure contacting of bumps provided at the concave portions 572. Likewise, the switch element substrate 120 and the spacer 540 are connected to each other by heating and pressure contacting of bumps 564 provided at the concave portions 574.

The metal film 592 provided to the spacer 540 is electrically connected to the ground electrode 134 of the switch element substrate 120 through the bumps 564. Therefore, the metal film 592 facing the switch element substrate 120 is constantly maintained at the ground potential. Therefore, the metal film 592 functions as an electromagnetic shield with respect to a circuit wiring 130 of the switch element substrate 120. As a result, a high-frequency characteristic of a transmission line path in the photoconductive switch module can assured.

Therefore, the photoconductive switch module 500 according to this embodiment has the good characteristic at a high frequency.

Sixth Embodiment

This embodiment aims at a manufacturing method of a photoconductive switch module, which is the same as the photoconductive switch module 100 of the first embodiment. The manufacturing method of the photoconductive switch module according to this embodiment will now be described with reference to FIGS. 13A to 13D.

Figure 13A:
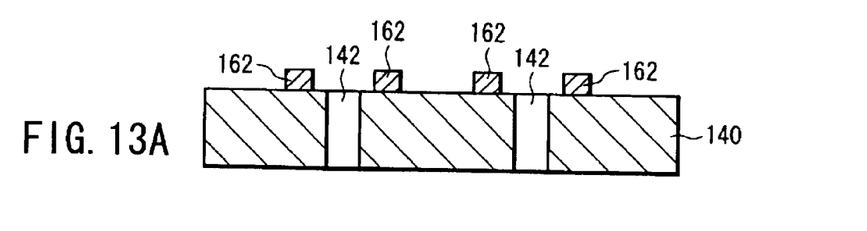
FIGS. 13A to 13D show manufacturing steps of a photoconductive switch module equal to that of the first embodiment illustrated in FIGS. 1 and 2.

A first step will be described in conjunction with FIG. 13A.

Gold ball bumps 162 as metal members are provided at predetermined positions on a first surface of the spacer 140 facing the light-emitting element substrate 110. It is preferable that the ball bumps are formed by a method called a ball bonding method. This method forms each bump by fusing and conglobing an end of a gold wire by arc discharge, pressing it against the substrate by ultrasonic waves and depositing it, and thereafter plucking away the wire. The thus formed bump has a sharpened end as different from the bump formed by plating and the like.

Figure 13B:
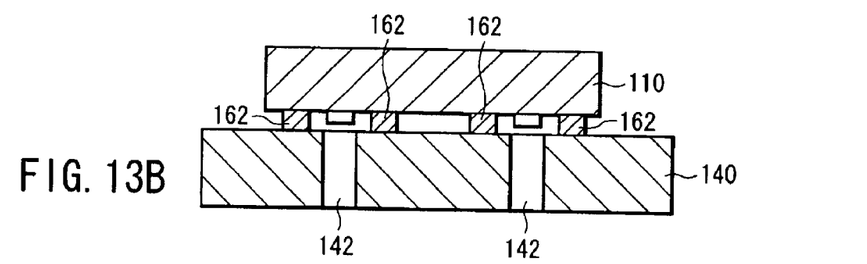

A second step will now be described with reference to FIG. 13B.

Although not shown, in the light-emitting element substrate 110, an area including parts where the bumps 162 are bonded is previously coated with a metal thin film including gold. The light-emitting element substrate 110 is mounted on the spacer 140 and heated, and a pressure is applied thereto. For example, it is preferable that heating is carried out at a temperature not less than 300 degrees and a pressure to be applied is not less than 10 g per bump. Since the strength is improved as a bonding time is longer, and hence it is good enough to appropriately set the time by which the necessary strength can be obtained.

At this step, the light-emitting element substrate 110 and the spacer 140 are bonded. Since the gold ball bumps are used, the sharpened ends of the bumps bite into and come into contact with the electrodes of the light-emitting element substrate 110 while collapsing, and they are electrically and mechanically excellently connected to each other.

Figure 13C:
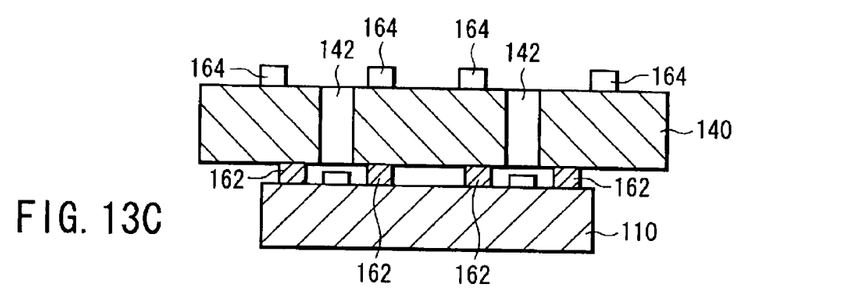

A third step will now be described with reference to FIG. 13C.

The structure manufactured at the second step is inverted in order to reverse the spacer 140, and bumps 164 are provided at predetermined positions of the spacer 140.

Figure 13D:
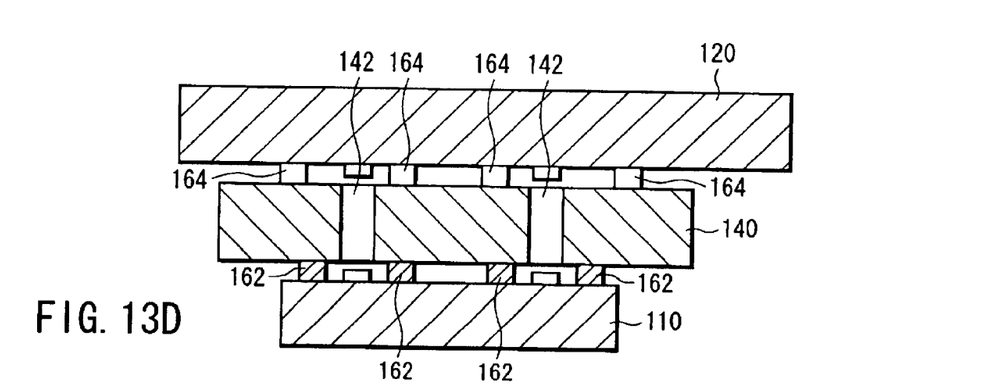

A fourth step will now be described with reference to FIG. 13D.

Although not shown, in the switch element substrate 120, an area including parts where the bumps 164 are bonded is previously coated with a metal thin film containing gold. The switch element substrate 120 is mounted on the spacer 140 and heated, and a pressure is applied thereto. Various conditions such as a heating temperature, a pressurization time, a processing time and others are set like that in case of bonding of the light-emitting element substrate 110 and the spacer 140.

At this step, the switch element substrate 120 and the spacer 140 are bonded, and the photoconductive switch module, which is the same as the photoconductive switch module 100 according to the first embodiment is manufactured.

The manufacturing method according to this embodiment can be also applied to manufacture of any other photoconductive switch modules according to the second to fifth embodiments.

For example, previously forming concave portions to the spacer before the first step enables manufacture of the photoconductive switch module like that according to the second embodiment or the fourth embodiment. Further, previously providing the electrode pads or the metal film to the spacer to which the concave portions are formed enables manufacture of the photoconductive switch module like that according to the third or fifth embodiment.

In the manufacturing method according to the present invention, since the bumps 162 and 164 are provided to the spacer 140, the stress such as ultrasonic waves at the time of forming the bumps is applied only to the spacer 140, and it is not applied to the light-emitting element substrate 110 or the switch element substrate 120. Therefore, the characteristic of the element having an electronic function such as the light-emitting element 112 or the photoconductive switch element 122 is not deteriorated. Furthermore, a possibility that the expensive light-emitting element substrate 110 or switch element substrate 120 is fractured is low.

As described above, according to this embodiment, since the light-emitting element substrate 110 and the switch element substrate 120 can be bonded to the spacer 140 without damaging the expensive light-emitting element substrate 110 or switch element substrate 120, it is possible to manufacture the photoconductive switch module having the good characteristic.

It is to be noted that bonding of the spacer 140 and the light-emitting element substrate 110 is carried out precedently in this embodiment, but it is needless to say that the same advantages can be obtained even if the spacer 140 and the switch element substrate 120 are bonded at first.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A photoconductive switch module comprising:
    a first substrate having light-emitting elements;
    a second substrate having photoconductive switch elements, whose number is equal to that of the light-emitting elements, the light-emitting elements and the photoconductive switch elements being arranged to face each other, the photoconductive switch elements being turned on/off in accordance with lighting/extinction of the light-emitting elements; and
    a third substrate arranged between the first substrate and the second substrate, the third substrate having the through holes, whose number is equal to that of the light-emitting elements, drive light emitted from the light-emitting element being trapped within the through hole to travel to the photoconductive switch element, and the first substrate and the third substrate being connected to each other by heating and pressure contacting of first metal members.

2. The photoconductive switch module according to claim 1, wherein the second substrate and the third substrate are connected to each other by heating and pressure contacting of second metal members.

3. The photoconductive switch module according to claim 1, wherein the third substrate has first concave portions formed on the side facing the first substrate, and the first metal members are provided at the first concave portions.

4. The photoconductive switch module according to claim 3, wherein the third substrate has first electrode pads provided at bottom surfaces of the first concave portions, second electrode pads provided at parts excluding the first concave portions in the surface facing the first substrate, and wirings electrically connecting the first electrode pads with the second electrode pads, the first metal members connecting the first substrate with the third substrate are provided on the first electrode pads so that the second electrode pads are electrically connected to the light-emitting elements through the first metal members.

5. The photoconductive switch module according to claim 2, wherein the third substrate has second concave portions formed on the side facing the second substrate, and the second metal members are provided at the second concave portions.

6. The photoconductive switch module according to claim 1, wherein the first metal members connecting the first substrate with the third substrate contain gold, and the first substrate and the third substrate respectively have metal thin films containing gold, which are provided in areas including parts where the first metal members are bonded.

7. The photoconductive switch module according to claim 2, wherein the second metal members connecting the second substrate with the third substrate contain gold, and the second substrate and the third substrate respectively have metal thin films containing gold, which are provided in areas including parts where the second metal members are bonded.

8. The photoconductive switch module according to claim 2, wherein the first metal members connecting the first substrate with the third substrate and the second metal members connecting the second substrate with the third substrate are provided at positions that overlap in a vertical direction of the third substrate.

9. The photoconductive switch module according to claim 2, wherein the second substrate has a wiring provided on the side facing the third substrate through the photoconductive switch and a ground electrode provided on the side facing the third substrate, the third substrate has an electro-conductive part at least in the vicinity of the surface facing the second substrate, and the electro-conductive part of the third substrate is electrically connected to the ground electrode of the second substrate through the second metal members connecting the second substrate with the third substrate.

10. The photoconductive switch module according to claim 4, wherein each first concave portion has slant side surface.

11. A manufacturing method of a photoconductive switch module that has a first substrate having light-emitting elements, a second substrate having photoconductive switch elements, whose number is equal to that of the light-emitting elements, and a third substrate arranged between the first substrate and the second substrate, the third substrate having through holes, whose number is equal to that of the light-emitting elements, the light-emitting elements and the photoconductive switch elements being arranged to face each other via through holes, the photoconductive switch elements being turned on/off in accordance with lighting/extinction of the light-emitting elements, and drive light emitted from each light-emitting element being trapped within each through hole to travel to each photoconductive switch element, the manufacturing method comprising:

providing first metal members on a first surface of the third substrate facing the first substrate; and connecting the first substrate with the third substrate by heating and pressure contacting of the first metal members.

12. The manufacturing method of a photoconductive switch module according to claim 11, further comprising:

providing second metal members on a second surface of the third substrate facing the second substrate; and connecting the second substrate with the third substrate by heating and pressure contacting of the second metal members.

* * * * *